(12) United States Patent
Kirn

(10) Patent No.: US 6,492,868 B2
(45) Date of Patent: Dec. 10, 2002

(54) DYNAMIC RANGE ENHANCEMENT TECHNIQUE

(76) Inventor: Larry Kirn, 7158 Valleybrook, West Bloomfield, MI (US) 48322

( * ) Notice: Subject to any disclaimer, the term of this patent is extended or adjusted under 35 U.S.C. 154(b) by 0 days.

(21) Appl. No.: 09/929,335

(22) Filed: Aug. 14, 2001

(65) Prior Publication Data

US 2002/0033733 A1 Mar. 21, 2002

Related U.S. Application Data

(60) Provisional application No. 60/225,222, filed on Aug. 14, 2000.

(51) Int. Cl.[7] ............................................... H03F 3/38
(52) U.S. Cl. ...................... 330/10; 330/207 A; 375/238; 332/109
(58) Field of Search ............................... 330/10, 207 A, 330/251; 327/172, 175, 176; 375/238; 332/109

(56) References Cited

U.S. PATENT DOCUMENTS

| | | | | |
|---|---|---|---|---|
| 3,931,584 A | * | 1/1976 | Motley et al. | 330/129 |
| 4,403,196 A | | 9/1983 | Grandmont | 330/10 |
| 4,471,314 A | | 9/1984 | Lindberg | 330/10 |
| 4,773,096 A | | 9/1988 | Kirn | 381/120 |
| 5,398,003 A | | 3/1995 | Heyl et al. | 330/10 |
| 5,610,553 A | | 3/1997 | Kirn | 330/10 |
| 5,613,010 A | | 3/1997 | Heyl et al. | 381/117 |
| 5,886,572 A | | 3/1999 | Myers et al. | 330/10 |
| 5,909,153 A | | 6/1999 | Delano et al. | 332/107 |
| 5,949,282 A | | 9/1999 | Nguyen et al. | 330/10 |
| 5,982,231 A | | 11/1999 | Nalbant | 330/10 |
| 6,114,980 A | * | 9/2000 | Tilley et al. | 341/118 |
| 6,150,880 A | | 11/2000 | Schweighofer | 330/207 A |
| 6,229,388 B1 | | 5/2001 | Nalbant | 330/10 |
| 6,392,476 B1 | * | 5/2002 | Rodriguez | 330/10 |

* cited by examiner

Primary Examiner—Robert Pascal
Assistant Examiner—Henry Choe
(74) Attorney, Agent, or Firm—Gifford, Krass, Groh, Sprinkle, Anderson & Citkowski, PC

(57) ABSTRACT

Apparatus and methods are disclosed for adding minimum pulse widths to the coarse resolution output of a multi-reference switching amplifier. This acts to null any detectable resultant differential by addition of a dynamic offset pulse width to the fine resolution output; thus extending operation to zero while presenting the imposed minimum pulse widths as a common-mode (null) signal. A preferred method according to the invention includes the steps of separating the input signal into coarse and fine resolution outputs, adding a minimum pulse width to the coarse resolution output; and adding a dynamic offset pulse width to the fine resolution output so as to null differential signals which would otherwise be present across the load. In terms of circuitry, a data separator is employed for separating the input signal into coarse and fine resolution outputs, and a summer adds the minimum pulse width to the coarse resolution output. Pulse-width modulation converters transform the modified coarse- and fine-resolution outputs prior to presentation to the load through routing logic.

2 Claims, 4 Drawing Sheets

DYNAMIC RANGE ENHANCEMENT TECHNIQUE

REFERENCE TO RELATED APPLICATION

This application claims priority from U.S. provisional application Ser. No. 60/225,222 filed Aug. 14, 2000, the entire contents of which are incorporated herein by reference.

FIELD OF THE INVENTION

This invention relates generally to electronic amplifiers and, in particular, to apparatus and methods for enhancing the dynamic range of multi-reference switching amplifiers.

BACKGROUND OF THE INVENTION

Many electronic devices operate on the principle of providing the integral of two or more switched voltage or current levels as an analog output. In order to modulate this analog output, the effective duty cycle of the switched voltages or currents is changed by various means in accordance with an input source. In such devices, predictable monotonic resolution is attainable only at pulse widths above the minimum imposed by the aggregate propagation delays of the physical system. Below this minimum, pulse widths obtained do not correlate linearly to their commanded width.

Multiple-reference switching amplifiers enhance resolution by switching two or more reference voltages to a load. Configurations of this type are described in patent application PCT/US99/26691, entitled 'Multi-Reference, High-Accuracy Switching Amplifier,' the contents of which are incorporated herein by reference.

Although the addition of a second reference voltage improves resolution, it does not directly address resolution near zero output, where propagation delays impact crossover distortion. In many applications, such as audio amplification, dynamic range requirements often make operation below this minimum desirable. Accordingly, a need exists to extend operation of these switching devices to facilitate resolutions significantly lower than their propagation delay.

SUMMARY OF THE INVENTION

This invention is directed to apparatus and methods for adding minimum pulse widths to the coarse resolution output of a multi-reference switching amplifier, and nulling any detectable resultant differential by addition of a dynamic offset pulse width to the fine resolution output; thus extending operation to zero while presenting the imposed minimum pulse widths as a common-mode (null) signal. Although the technique is described with reference to the coarse-resolution signal, it is equally applicable to the fine-resolution signal, or both.

A preferred method according to the invention includes the steps of separating the input signal into coarse and fine resolution outputs, adding a minimum pulse width to the coarse resolution output; and adding a dynamic offset pulse width to the fine resolution output so as to null differential signals which would otherwise be present across the load.

In terms of circuitry, a data separator is employed for separating the input signal into coarse and fine resolution outputs, and a summer adds the minimum pulse width to the coarse resolution output. Pulse-width modulation converters transform the modified coarse- and fine-resolution outputs prior to presentation to the load through routing logic.

DETAILED DESCRIPTION OF THE INVENTION

Figure 1:
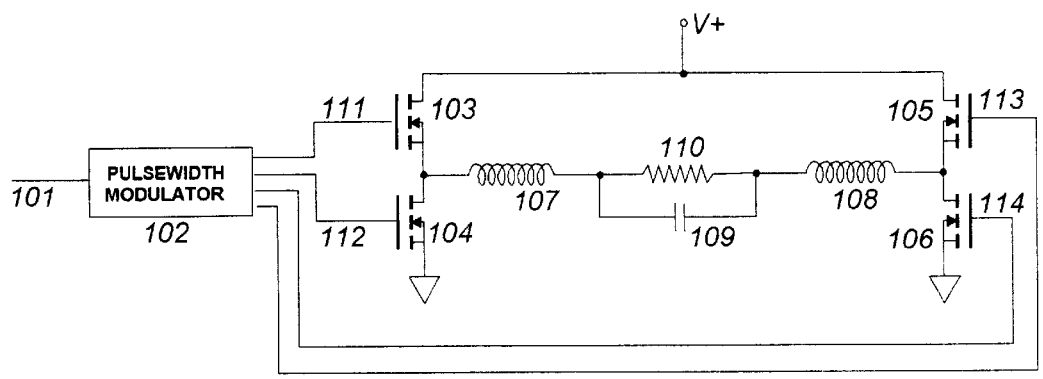
FIG. 1 is a block diagram of a prior-art bridged-output Class D (PWM) amplifier.

FIG. 1 is a block diagram of a prior-art bridged-output Class D (PWM) amplifier. Pulse-width modulator 102 converts incoming data stream 101 into pulse-width modulated drive signals 111, 112, 113, and 114, which drive switching devices 103, 104, 105, and 106, respectively. Inductors 107 and 108, in conjunction with capacitor 109, filter switching components from the outputs of said switching devices, and supply analog output to load 110. Operation of this type of amplifier is well known in the art.

Figure 2:
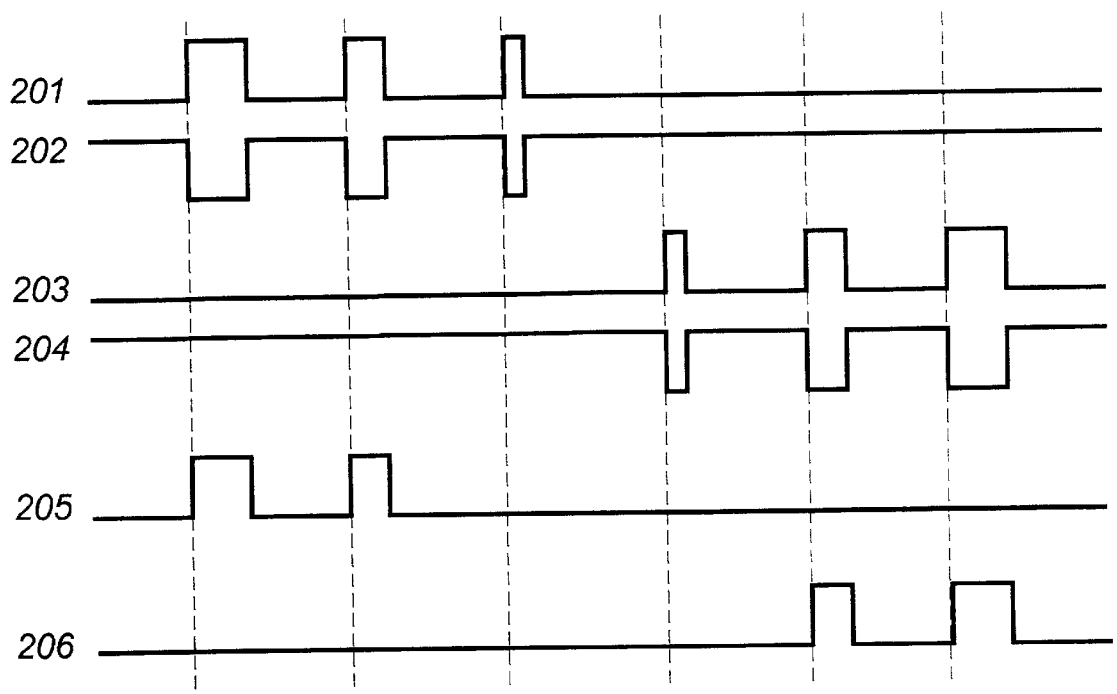
FIG. 2 shows the timing of signals normally encountered in the circuit of FIG. 1 as a low-level signal traverses zero.

Referring now to FIG. 2, traces 201 and 202 show inputs to switching devices 103 and 104, respectively, and trace 205 shows output from switching devices 103 and 104 to inductor 107, all of FIG. 1. Trace 203 and 204 show inputs to switching devices 105 and 106, respectively, and trace 206 shows output from switching devices 105 and 106 to inductor 108, again all of FIG. 1. At small pulse widths, it can be seen that outputs do not accurately represent inputs; output pulses may be elongated or missing.

Figure 3:
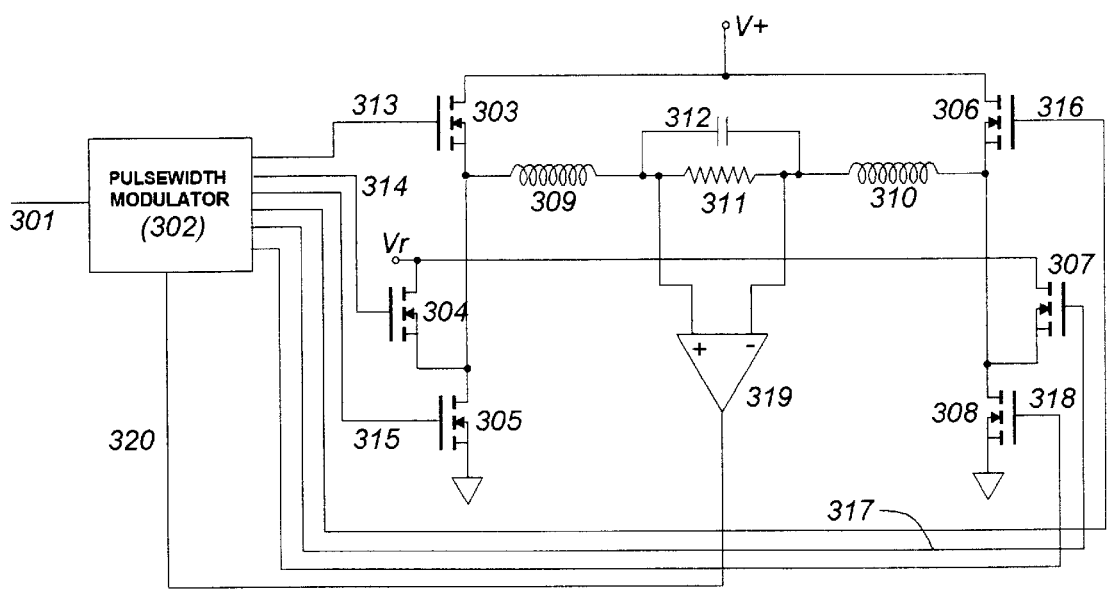
FIG. 3 is a circuit diagram of a multi-reference, bridged-output switching amplifier incorporating techniques according to the invention.

FIG. 3 is a circuit diagram of a multi-reference, bridged-output switching amplifier incorporating techniques according to the invention. Pulse-width modulator 302 converts incoming data stream 301 into pulse-width modulated drive signals 313, 314, 315, 316, 317, and 318, which drive switching devices 303, 304, 305, 306, 307, and 308, respectively. Inductors 309 and 310, in conjunction with capacitor 312, filter switching components from the outputs of the switching devices, and supply analog output to load 311.

Switching devices 303 and 306 source V+ to inductors 309 and 310, respectively, when activated. Switching devices 304 and 307 source $V_r$, which is substantially lower than V+, to the inductors, respectively. Switching devices 305 and 308 connect the inductors, respectively, to ground in the absence of competing control signals. The basic operation of this type of amplifier is described in pending application PCT/US99/26691 referenced above.

Figure 4:
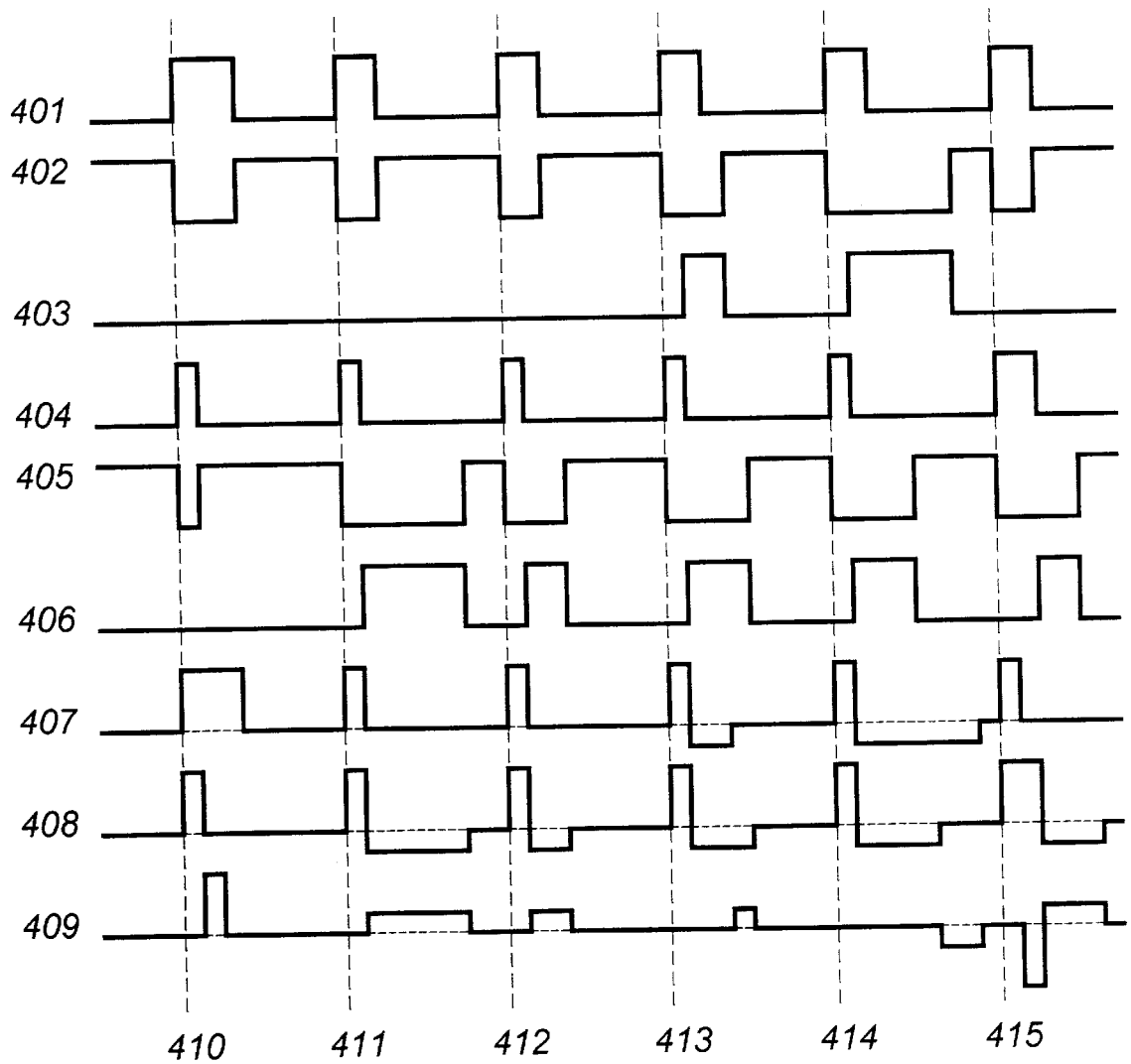
FIG. 4 shows the timing of signals resultant from the present technique applied to the amplifier of FIG. 3 as a low-level signal traverses zero.

According to this invention, operational amplifier 319 receives as input the differential imposed across load 311, and supplies feedback signal 320 to pulse-width modulator 302. Traces 401, 402, 403, 404, 405, and 406 of FIG. 4 show the inputs to switching devices 303, 304, 305, 306, 307, and 308, respectively, of FIG. 3. Traces 407 and 408 show output voltages from switching devices 303, 304, and 305 to inductor 309, and output voltages from switching devices 306, 307, and 308 to inductor 310, respectively, all of FIG. 3. Trace 409 represents the difference between traces 408 and 407, the filtered version of which is ultimately presented to load 311 of FIG. 3.

At time marker 410, a pulse width calculated by pulse-width modulator 302 from the incoming data value, plus a minimum pulse width, activates switching device 303. Concurrently, a minimum pulse width activation of switching device 306 is output. In this sample, the incoming fine data is assumed to be zero, so no activation occurs in trace 406. The net output seen in trace 409 for this sample period is therefore (coarse data value*V+).

At time marker 411, the coarse data value is zero, so concurrent minimum pulse widths are output to both switching devices 303 and 306. The fine data value is non-zero, such that a pulse width consisting of the fine data value then activates switching device 308, as seen in trace 406.

The net output seen in trace 409 for this sample period is therefore (fine data value*Vr). At time marker 412, a smaller fine data value is received, with a coarse data value of zero. Resultantly, the net output seen in trace 409 for this sample period is a shortened version of the previous period between markers 411 and 412. At time marker 413, the sign of the incoming data changes, and a small fine data value is received with coarse data value of zero.

As expected, the minimum pulse widths presented to switching devices 303 and 306 are followed by a pulse width representative of the incoming fine data value at switching device 305, as seen in trace 403. However, a following pulse is as well output to switching device 308, seen in trace 406. This is an offset value added by pulse width modulator 302, in response to previous input from operational amplifier 391 indicating a need for offset correction in the indicated polarity in order to obtain a null output at zero.

Note that this offset pulse width (seen in trace 406) is applied for all outputs of this polarity after time markers 414 and 415 as well. The net outputs seen in trace 409 for the samples between markers 413 and 414, and markers 414 and 415, are therefore (offset value*Vr)−(fine data value*Vr). The net output seen in trace 409 for the sample at marker 415 is (offset value*|Vr)+(coarse data value*V+), since the fine data value is zero, indicated by the lack of assertion in trace 403.

Figure 5:
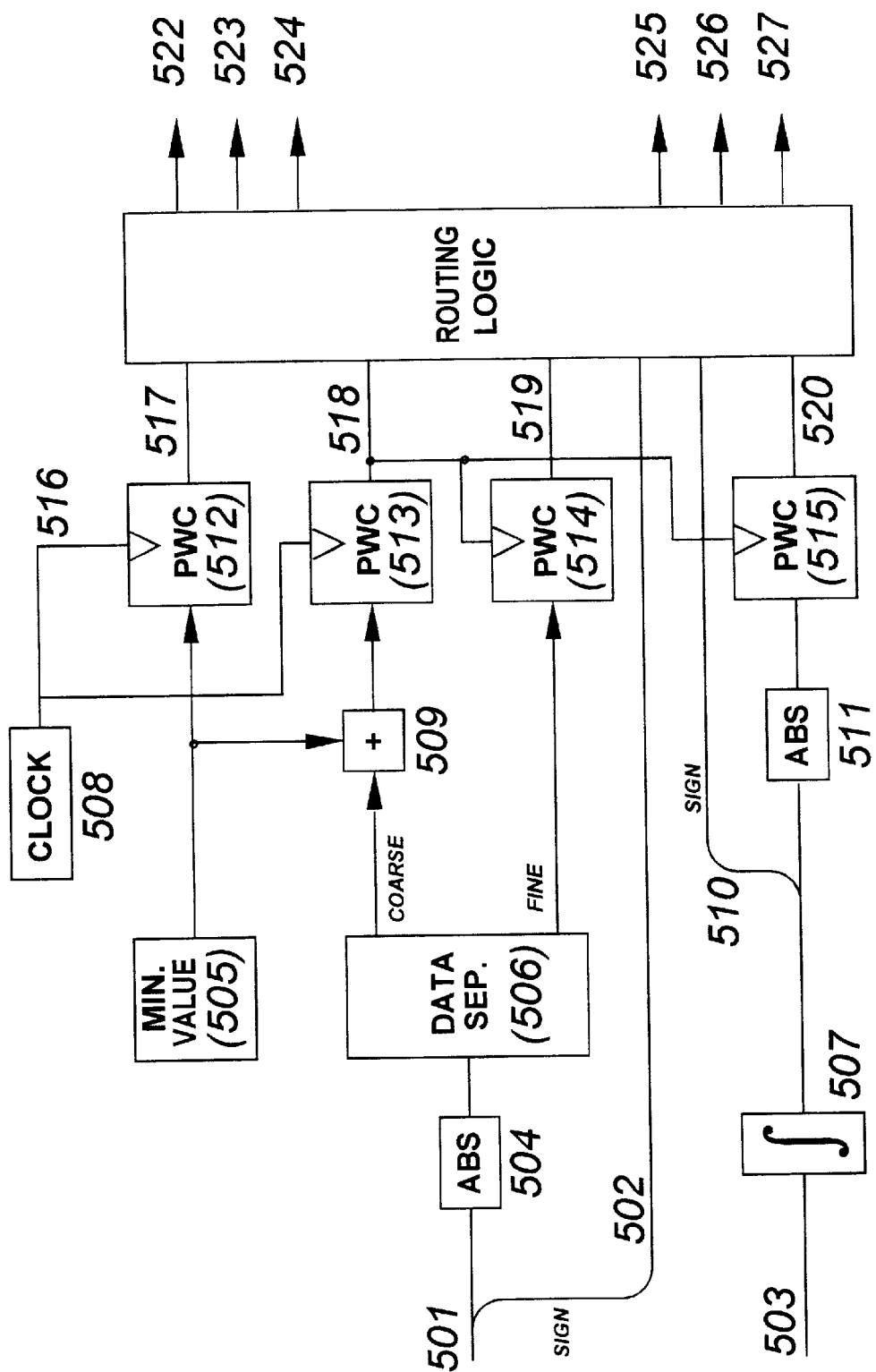
FIG. 5 is a diagram depicting circuitry associated with the pulse-width modulator of FIG. 3.

Referring now to FIG. 5, incoming data stream 501 is input to absolute value generator 504, the output of which is input to data separator 506, which separates incoming data into coarse and fine resolution data streams. Resultant coarse data is summed with a minimum value 505 by summer 509 before application to pulse width converter 513. The minimum value is also applied to pulse-width converter 512 as input. The fine data output from data separator 506 is input to pulse-width converter 514.

Feedback signal 503, received from operational amplifier 319 of FIG. 3, is applied to integrator 507, the output of which is delivered to absolute value generator 511, which supplies data to pulse-width converter 515.

The output sampling rate of the system is driven by clock 508, which triggers pulse-width converters 512 and 513. Pulse-width converters 514 and 515 are triggered by the de-assertion of the output of pulse width converter 513.

The operation just described results in pulse-width train 517, representative of minimum value 505 and pulse width train 518, representative of the coarse data value plus minimum value 505; followed by pulse width train 519, representative of the fine data value, and pulse width train 520, representative of the absolute value of integrator 507. Being driven by a feedback signal, integrator 507 provides an offset correction factor discussed with reference to FIG. 4 that moves the amplifier output toward an average of zero across load 311 of FIG. 3.

Pulse-width trains 517, 518, 519, and 520, along with the sign indications of incoming data stream 501 and integrator 507, are applied as input to output routing logic 521, which routes said pulse width trains to switching device control signals 522, 523, 524, 525, 526, and 527, which correspond to signals 313, 314, 315, 316, 317, and 318 of FIG. 3, respectively. Functional description of said routing logic 521 is available in patent application referenced above, but may as well be seen in FIG. 4.

Feedback data may be either qualitative or quantitative. In addition, although voltage references are disclosed, it will be apparent to one of skill in the art that equivalent operation using currents is possible through appropriate circuit modification.

I claim:

1. A method of enhancing the dynamic range of a switching amplifier of the type wherein multiple references are switched to a load in accordance with an input signal, the method comprising the steps of:

separating the input signal into coarse and fine resolution outputs;

adding a minimum pulse width to the coarse resolution output; and adding a dynamic offset pulse width to the fine resolution output so as to null differential signals which would otherwise be present across the load.

2. Apparatus for enhancing the dynamic range of a switching amplifier of the type wherein multiple references are switched to a load in accordance with an input signal, comprising:

a data separator for separating the input signal into coarse and fine resolution outputs;

a minimum pulse width generator;

a summer for adding the minimum pulse width to the coarse resolution output; and circuitry for adding a dynamic offset pulse width to the fine resolution output; and converters for pulse-width modulating the modified coarse- and fine-resolution outputs for presentation to the load.

* * * * *